United States Patent [19]
Babassi et al.

[11] Patent Number: 6,123,804
[45] Date of Patent: Sep. 26, 2000

[54] SECTIONAL CLAMP RING

[75] Inventors: Michael Babassi, San Jose; David Hutnick, Milpitas, both of Calif.

[73] Assignee: Applied Materials, Inc., Santa Clara, Calif.

[21] Appl. No.: 09/255,033

[22] Filed: Feb. 22, 1999

[51] Int. Cl.[7] .............................. C23C 16/00; H05H 1/00
[52] U.S. Cl. ........................ 156/345; 118/728; 118/715
[58] Field of Search ............................ 156/345; 118/728, 118/721, 715

[56] References Cited

U.S. PATENT DOCUMENTS

| | | | |
|---|---|---|---|
| 5,421,401 | 6/1995 | Sherstinsky et al. | 165/80.2 |
| 5,437,757 | 8/1995 | Rice et al. | 156/345 |
| 5,534,110 | 7/1996 | Lenz et al. | 156/345 |
| 5,725,718 | 3/1998 | Banholzer et al. | 156/345 |
| 5,810,931 | 9/1998 | Stevens et al. | 118/721 |
| 5,860,640 | 1/1999 | Marohl et al. | 269/289 |
| 5,885,428 | 3/1999 | Kogan | 156/345 |
| 5,888,304 | 3/1999 | Umotoy et al. | 156/345 |

OTHER PUBLICATIONS

Vespel Clamp Ring Assembly, M.E.C. Tech, Inc. Copyright 1998.

*Primary Examiner*—Shrive Beck
*Assistant Examiner*—Parviz Hassanzadeh
*Attorney, Agent, or Firm*—Thomason Moser Patterson

[57] ABSTRACT

The present invention provides a multi-piece clamp ring, adapted to be used in plasma assisted and other processes in electronic device fabrication and is especially suitable for use in an etching or deposition process. The clamp ring includes an upper shield portion that typically is consumed in the etching process and a lower ring portion protected by the upper shield portion which can be re-used. The upper shield portion protects the lower ring portion from the etching process. The upper shield portion is adapted to be fastened to a chamber member to retain alignment with a substrate during the etching process. The lower ring portion is allowed to move and align itself with the upper shield portion or be removably fastened with the upper shield portion.

18 Claims, 5 Drawing Sheets

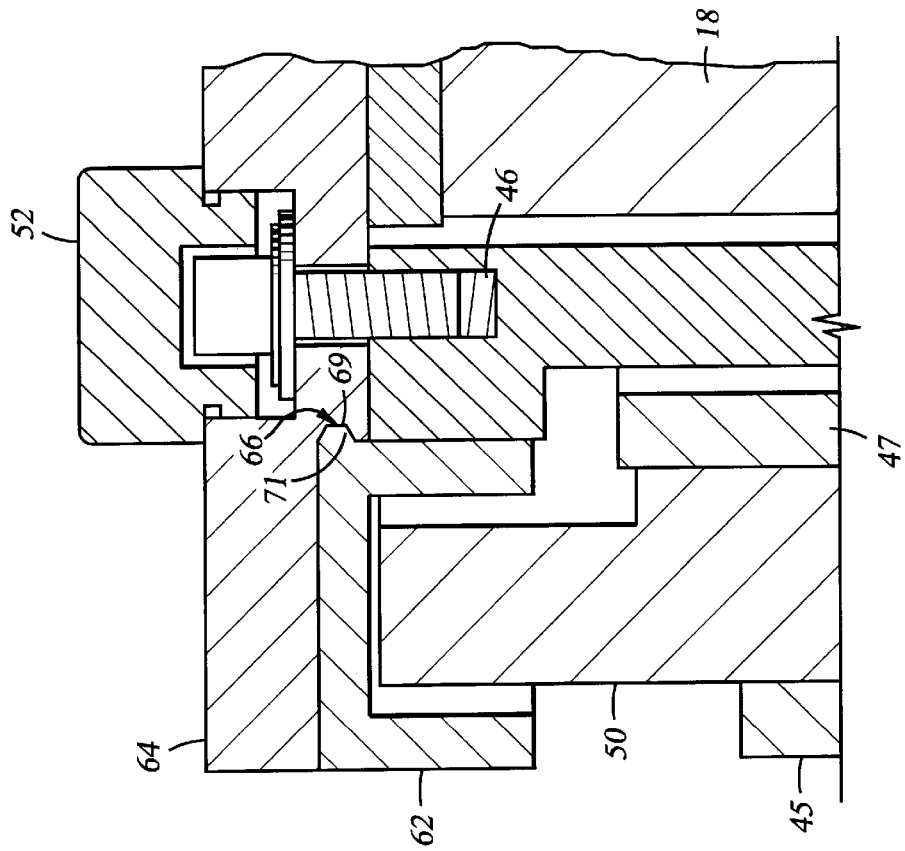
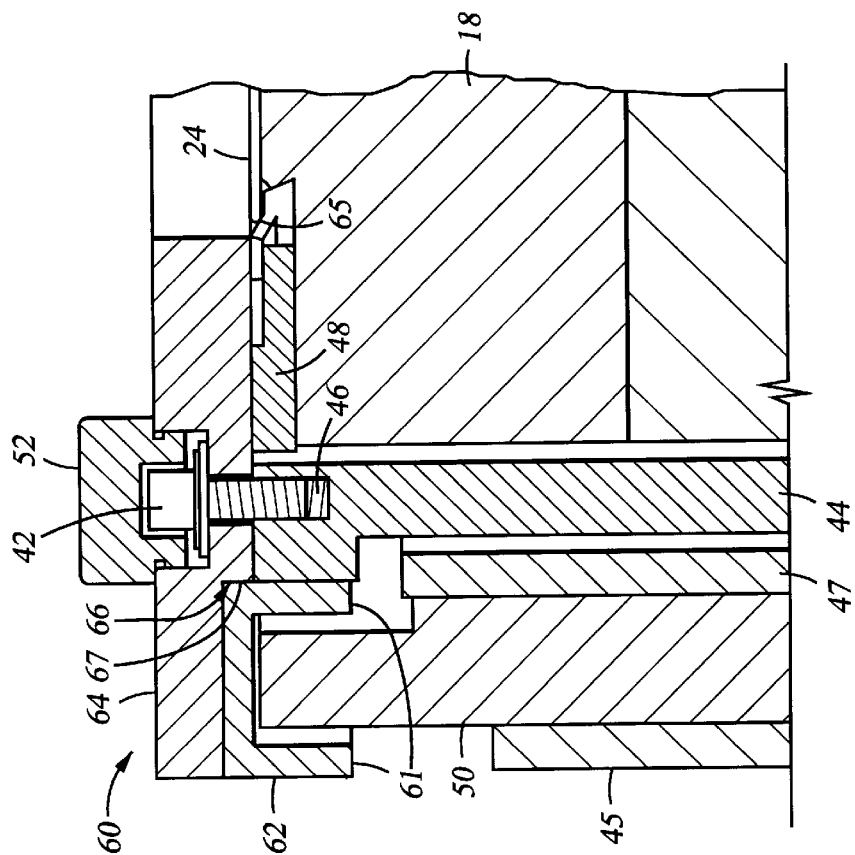

SECTIONAL CLAMP RING

BACKGROUND OF THE INVENTION

1. Field of the Invention

The present invention relates to semiconductor processing. More particularly, the present invention relates to clamp rings for securing a work piece or substrate in a processing chamber.

2. Background of the Related Art

In the manufacturer of integrated circuits and other electronic devices, multiple layers of dielectric, conducting, and semiconducting materials are deposited and etched from the surface of substrates. Typically, substrates are positioned within vacuum processing chambers where plasma reactions are performed to either deposit material on the substrate or etch material from the substrate. In order to protect the edge of substrates and to secure substrates to the support member during processing, clamp rings are sometimes used to contact the edge of the substrate during processing. After many hours of operation, typically hundreds of hours, the upper surfaces of the clamp ring can be eroded by etching processes or can collect deposition material in deposition processes. As a result, the clamp ring must be replaced.

FIG. 1 is a perspective view of one type of clamp ring used in the field. The clamp ring 100 generally includes downwardly extending flanges 102 that protect portions of a processing chamber in an etching process. The clamp ring also includes tabs 104, otherwise known as "fingers", that engage the edge of a substrate 24 positioned on a support member, such as a pedestal, in a processing chamber. The tabs 104 extend radially inward of the clamp ring and are used to hold the substrate during processing. The clamp ring is mounted on a lift mechanism in the chamber by inserting a fastener, such as a screw, through a hole 108 and a counterbore 106. A cap 110 may be used to cover the fastener and protect the fastener from the etching process. The upper surface 112 of the clamp ring is exposed primarily to the etching process and erodes from continued use and must eventually be replaced.

Unfortunately, in some processes the material from which the clamp ring is made is very expensive. As one example, a VESPEL® clamp ring is typically used in some etching processes. The clamp ring includes not only a shielding and clamping portion, but also an annular ring portion which serves as a support for the clamp ring and/or as a shield. Difficult machining also adds cost to the clamp ring.

Therefore, there is a need for a clamp ring which can be easily replaced and which does not require difficult machining.

SUMMARY OF THE INVENTION

The present invention provides a multi-piece clamp ring, adapted to be used in plasma assisted and other processes in electronic device fabrication and is especially suitable for use in an etching or deposition process. The clamp ring includes an upper shield portion that typically is consumed in the etching process, or covered with deposition material in a deposition process, and a lower ring portion protected by the upper shield portion which can be re-used. The upper shield portion protects the lower ring portion from the etching process. The upper shield portion is adapted to be fastened to a chamber member to retain alignment with a substrate during the etching process. The lower ring portion is allowed to move and align itself with the upper shield portion or be removably fastened with the upper shield portion.

In one aspect, the present invention includes a multi-piece consumable clamp ring for use in a processing chamber, having a U-shaped annular lower ring portion, and an annular upper shield portion adaptable to receive the lower ring portion during processing in an abutting relationship.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is a cross-sectional view of the clamp ring of the present invention.

FIG. 5 is a cross-sectional view of an alternative embodiment of the clamp ring.

DETAILED DESCRIPTION OF THE PREFERRED EMBODIMENT

The present invention provides a multi-piece clamp ring, adapted to be used in plasma assisted and other processes in electronic device fabrication and is especially suitable for use in an etching or deposition process. The clamp ring includes an upper shield portion that typically is consumed in the etching process and a lower ring portion protected by the upper shield portion which can be re-used. The upper shield portion protects the lower ring portion from the etching process. The upper shield portion is adapted to be fastened to a chamber member to retain alignment with a substrate during the etching process. The lower ring portion is allowed to move and align itself with the upper shield portion or be removably fastened with the upper shield portion. It is to be understood that the clamp ring of the invention can be used to advantage in a number of chambers and processes, including both etching and deposition processes. The etching and deposition processes include etching chambers, physical vapor deposition (PVD) chambers, chemical vapor deposition (CVD) chambers, and other processing chambers using in the manufacture of devices. Some rings clamp the substrate in position while other rings shield, or effect a "shadow" for, the substrate typically at the substrate edge. Therefore, the term "clamp ring" includes clamp rings and shadow rings herein.

Figure 1:
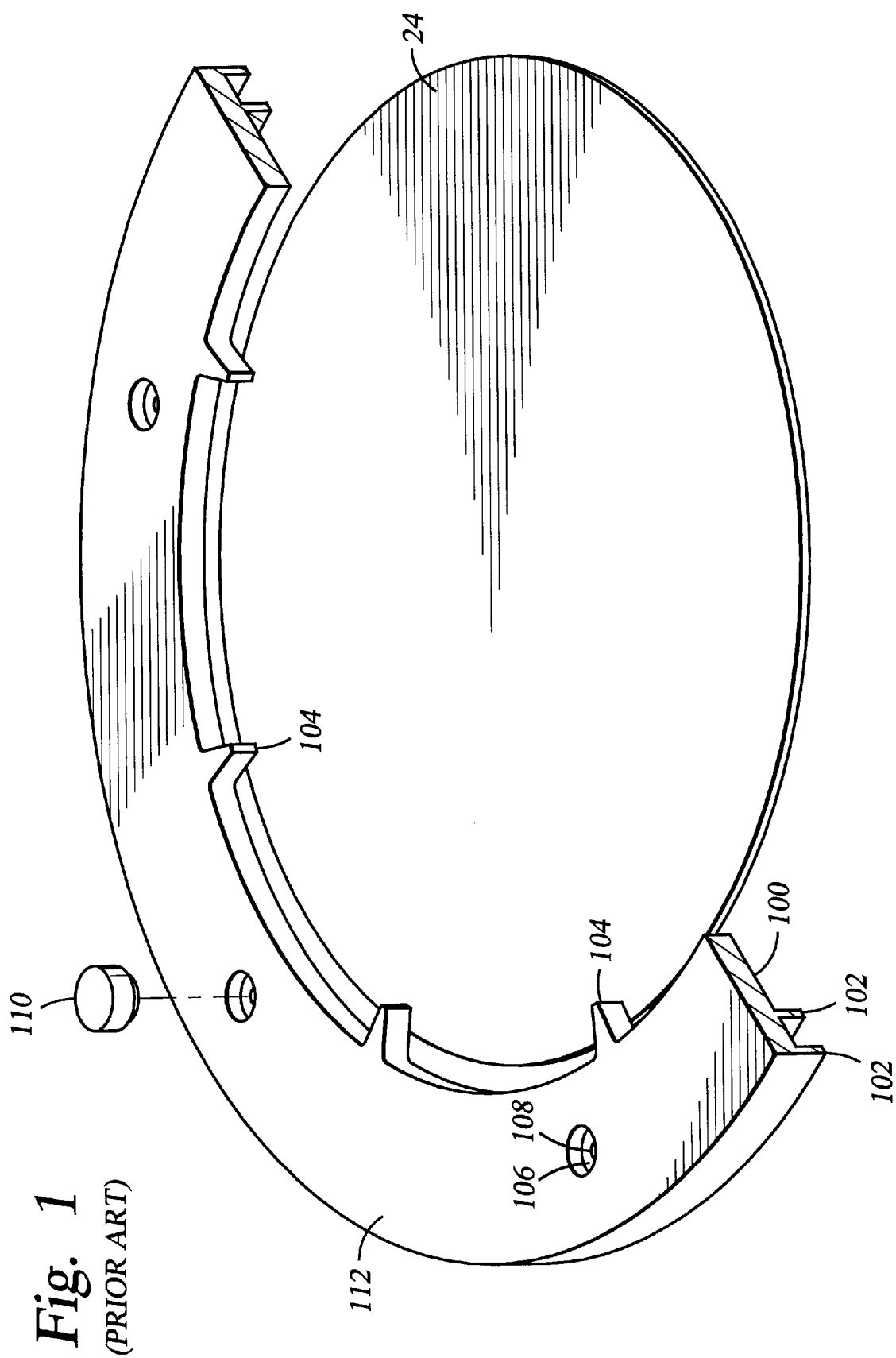
FIG. 1 is a perspective view of a standard clamp ring used with a substrate in an etch processing chamber.
Figure 2:
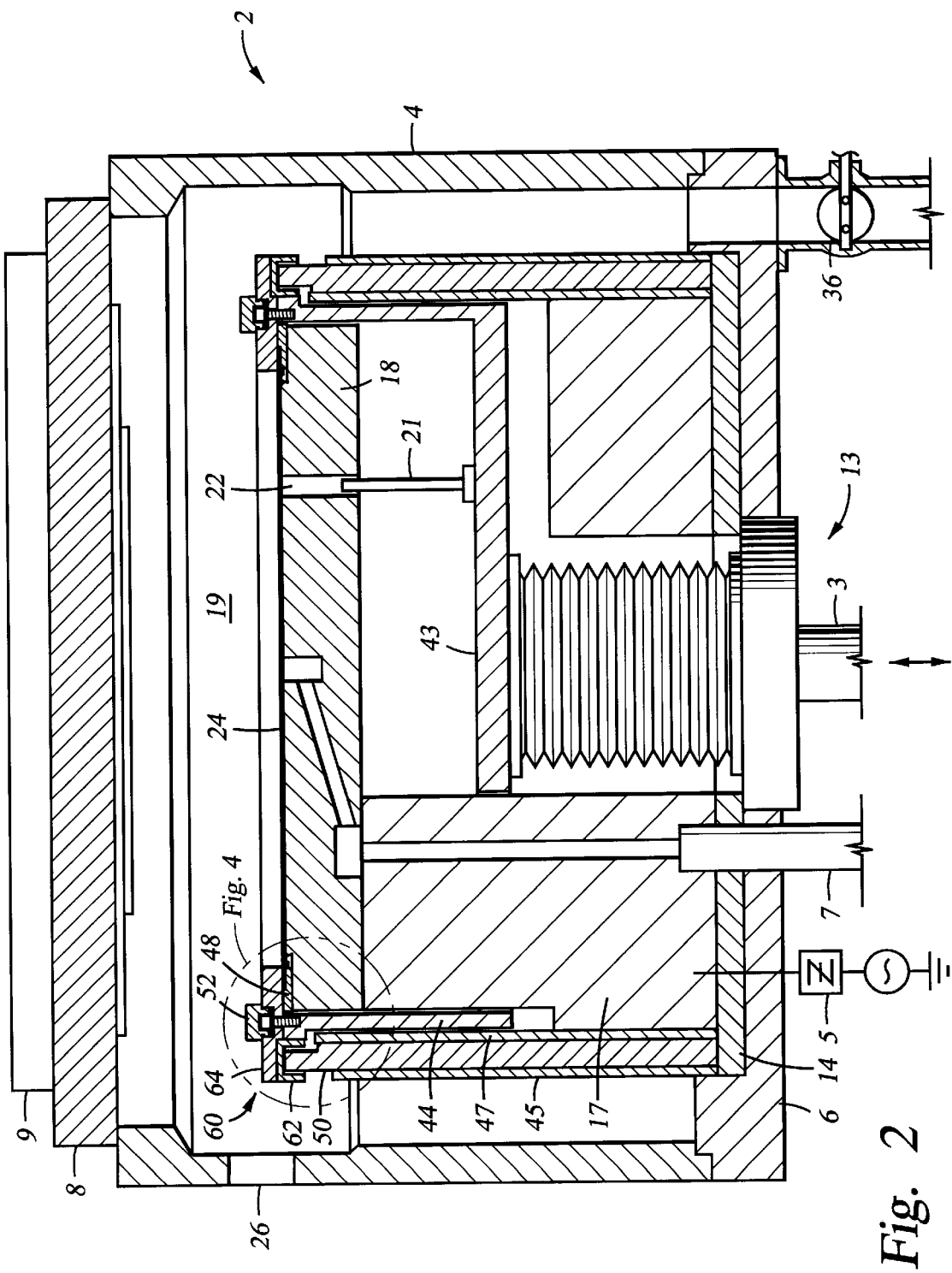
FIG. 2 is a schematic view of an etching chamber, in which the present invention may be used.

By way of example, FIG. 2 is a schematic view of a plasma etching chamber, such as a MxP+™ chamber, available from Applied Materials, Inc. of Santa Clara, Calif. in which the present invention can be used to advantage. The chamber 2 includes sidewalls 4, bottom wall 6, and lid 8. The sidewalls 4 have a slit 26 for loading and unloading a substrate into and from the chamber. Cathode 17 is located above an insulating flange 14 and is connected to a cathode power supply 5. The cathode power supply 5 typically biases the cathode to a negative voltage so that the ions from the plasma are attracted to a substrate 24. The insulating flange 14 electrically separates the grounded chamber from the base of the cathode 17. A pedestal 18 is mounted to the cathode 17 and provides a support surface for the substrate 24. The substrate 24 is disposed on the top surface of the pedestal and is horizontally disposed within the collar 48. A clamp ring 60 restrains the substrate to the pedestal surface when helium or another inert gas is applied to the back side of the substrate through the gas channel 7. The chamber walls, lid, and bottom are typically grounded. An RF power supply 9 is located above the lid 8 to create a plasma in the reaction zone 19 between the chamber walls and the electrically charged pedestal 18. Excessive process gases and volatile compounds produced in processing are exhausted through the gas outlet 36.

In some chambers, an external tube 45 surrounds the cathode and other components and is typically grounded with the chamber. The external tube 45 is insulated from the cathode by an insulating liner 50, known as a "quartz pipe". An inner cylinder 47, which is electrically charged through contact with the cathode, is placed inwardly of the insulating liner 50. The cathode, insulating liner, external tube, and inner cylinder are typically fixedly attached to the chamber and remain stationary during processing.

A lift mechanism 13 allows the clamp ring 60 to be raised and lowered for the placement of substrates into and from the chamber. A lift actuator (not shown) is attached to a shaft 3 which raises and lowers a lift platform 43. A plurality of lift pins 21 are connected to the lift platform and moveably engage a lift pin hole 22 in the pedestal 18. The clamp ring 60 includes an annular lower ring portion 62 and an annular upper shield portion 64. The annular upper shield portion 64 is attached to a mounting ring 44, which is connected to the lift platform 43.

In operation, a robot arm (not shown) inserts a substrate 24 into the chamber through the slit 26. The lift mechanism 13 raises the clamp ring 60 and lift pins 21 to receive the substrate 24 from the robot arm between a vertical separation of the clamp ring and lift pins. The lift pins engage the substrate and continue to rise so that the substrate is removed from the robot arm. The robot arm retracts from the chamber and a door (not shown) seals the chamber. The lift mechanism then lowers the pins, substrate, and clamp ring to deliver the substrate onto the pedestal 18. As the lift mechanism continues to lower, the lift pins recede through the lift pin holes 22 and the clamp ring 60 contacts the upper surface of the substrate 24. When the process is complete, the lift mechanism raises the clamp ring and the lift pins which lift the substrate from the pedestal to an upper position to allow the robot arm to enter the chamber and retrieve the substrate.

Figure 3:
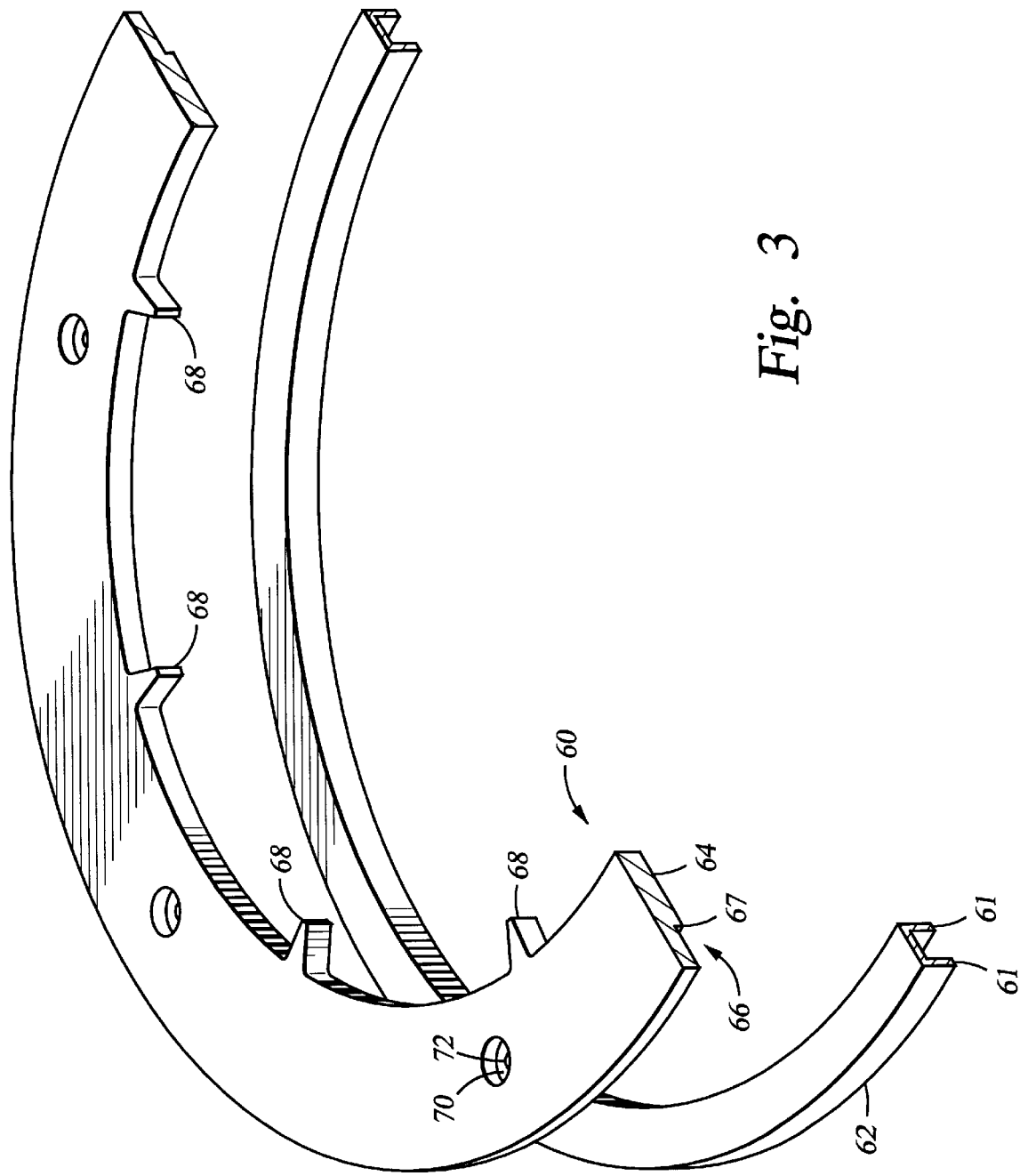
FIG. 3 is a perspective view of a clamp ring of the present invention.

FIG. 3 is a perspective view of one clamp ring of the present invention. The clamp ring 60 generally comprises two pieces, an annular lower ring portion 62 and an annular upper shield portion 64. The upper shield portion 64 is disposed radially inward of the lower ring portion at an interface 66 formed by a shoulder 67 on the upper shield portion. The shoulder 67 assists in positioning the upper shield portion with respect to the lower ring portion. Tabs 68 extend radially inward of the upper shield portion and are used to clamp the substrate 24 on the pedestal during processing. A counterbore 70 is partially formed in the upper shield portion and provides a recess for a fastener 42. The fastener is preferably inserted through the hole 72 to connect the upper shield portion to the mounting ring 44 as shown in FIG. 4.

FIG. 4 is a cross-sectional view of the clamp ring of the present invention with a substrate positioned on a pedestal 18. In this embodiment, the pedestal 18 includes a generally flat upper surface, which may include one or more grooves therein to distribute heat transfer gas which is ported through the pedestal 18 to the backside of the substrate 24 mounted on the pedestal, and an edge ring or collar 48 extending around the perimeter of the upper surface. A seal 65, such as a lip seal, is disposed radially inwardly of the collar, to help seal the region between the backside of the substrate and the flat substrate mounting surface of the pedestal 18, when the substrate is pressed against the seal by the clamp ring. A substrate 24 when positioned on the pedestal 18 extends over the collar 48 and when pushed against the pedestal by the clamp ring 60 deforms seal 65 to seal the region between the substrate and pedestal.

To form the clamp ring, the upper shield portion 64 is held in position relative to the lower ring portion 62 with a plurality of fasteners 42 that are fastened to a mounting hole 46 in the mounting ring 44. The fasteners may also fix the alignment of the upper shield portion to the mounting ring. The lower ring portion is allowed to "float" on the insulating liner 50. That is, the lower ring portion may be unattached to that chamber member so that when the upper shield portion is connected to the mounting ring 44 by the fasteners 42, the lower ring portion is allowed to laterally move to align itself with the shoulder 67 on the upper shield portion. Alternatively, the lower ring portion may be flexibly attached to the chamber, so that the lower ring portion may move laterally within acceptable limits to align itself with the shoulder 67 on the upper shield portion. A cover 52 is located above each fastener 42 to protect the fastener 42 from the etching process.

The lower ring portion 62 has two downwardly extending flanges 61 that overlap the insulating liner 50. External tube 45 and inner cylinder 47 are positioned on either side of the insulating liner 50. The downwardly extending flanges 61 function as a barrier to prevent arcing between the tube 45 and the cylinder 47.

In chambers which use a lift mechanism 13 in conjunction with the lift platform 43 and mounting ring 44, shown in FIG. 2, to elevate the clamp ring above the pedestal, the upper shield portion 64 may be raised above the insulating liner 50. The flanges 61 can be sized to extend downwards a sufficient distance so that the lower ring portion remains in relative position over the insulating liner 50.

In some instances, it may be preferable to secure the lower ring portion to the upper shield portion so that the two pieces remain aligned as the upper shield portion is raised and lowered, as shown in FIG. 5. At the interface 66, the lower ring portion and upper shield portion could remain connected during processing and be removable for replacement of the upper shield portion. Also, the interface 66 could include a rib or protrusion 71 on one ring portion and a detent 69 on another ring portion to secure the ring portions together. The ring portions could also be attached by pins, adhesives, fasteners, and in other ways that would allow the separation of the ring portions for replacement of the upper shield portion at a later date.

Figure 6:
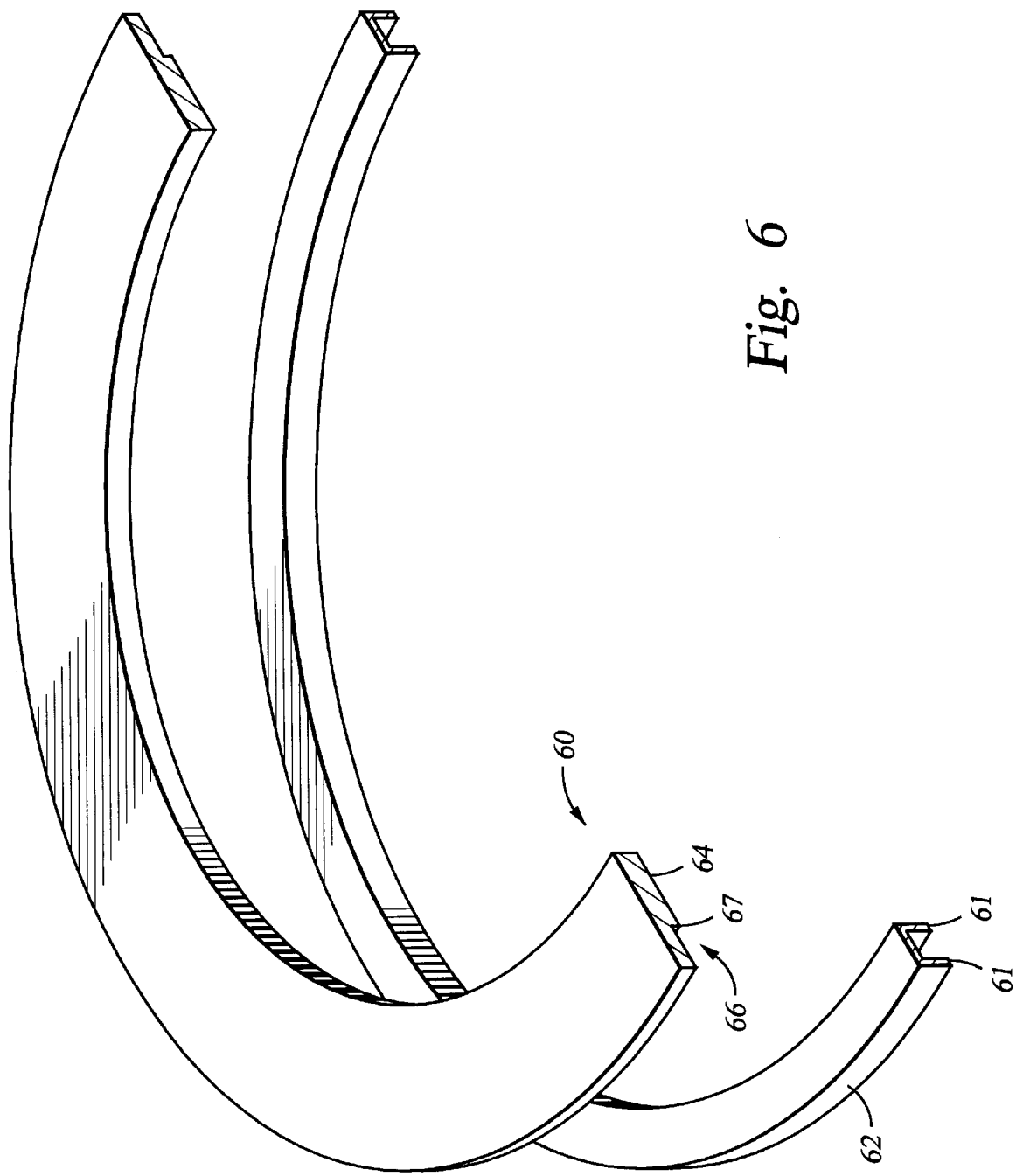
FIG. 6 is a perspective view of an alternative embodiment of a clamp ring of the present invention.

FIG. 6 shows another embodiment of the clamp ring without the counterbore and hole used for a fastener and the tabs as shown in FIGS. 3 and 4. The embodiment of FIG. 6 could be used in a processing chamber not requiring mounting of the clamp ring, such as a PVD chamber. The clamp ring may be supported by a shield above pedestal and the pedestal raises and lowers the substrate into position below the clamp ring.

The clamp ring of the present invention is particularly useful for clamp rings formed of consumable material, such as Vespel®, a high density plastic material, polyimides, polymers, and other materials conducive to etching and deposition processes.

While foregoing is directed to the preferred embodiment of the present invention, other and further embodiments of the invention may be devised without departing from the basic scope thereof, and the scope thereof is determined by the claims that follow.

What is claimed is:

1. A multi-piece consumable clamp ring for use in a processing chamber, comprising:
  a) a downwardly extending U-shaped annular lower ring portion adapted to be positioned between two electrically chargeable members; and
  b) an annular upper shield portion separate from the lower ring portion substantially covering an upper surface of the U-shaped annular lower ring portion, wherein the lower ring portion and the upper shield portion are adapted to be releasably coupled together.

2. The clamp ring of claim 1, further comprising a shoulder on the upper shield portion to align the upper shield portion and lower ring portion with respect to each other.

3. The clamp ring of claim 1, further comprising a plurality of holes in the upper shield portion adapted to attach the upper shield portion independently of the lower ring portion to a chamber member in the processing chamber.

4. The clamp ring of claim 3, further comprising a recessed area in the upper shield portion adapted to at least partially allow a head of a fastener to recess into the upper shield portion.

5. The clamp ring of claim 4, further comprising a cap adapted to cover the fastener.

6. The clamp ring of claim 3, wherein the lower ring portion is unattached to the chamber to allow the lower ring portion to be aligned with the upper shield portion.

7. The clamp ring of claim 6, wherein the lower ring portion is adapted to be aligned with a shoulder on the upper shield portion.

8. The clamp ring of claim 1, wherein the upper shield portion and lower ring portion are releasable coupled together with a protrusion on one of the portions and a corresponding detent on the other portion.

9. A processing system, comprising:
  a) a chamber having a bottom, sidewalls, and a top;
  b) a substrate supporting surface inside the chamber;
  c) a power supply adapted to created a plasma in the chamber;
  d) a multi-pieces clamp ring having an upper shield portion and a downwardly extending U-shaped lower ring portion that is at least partially shielded from processing in the processing system, wherein the upper shield portion and the lower ring are releasably coupled together.

10. The system of claim 9, further comprising a lift mechanism adapted to lower and raise the clamp ring.

11. The system of claim 9, wherein the U-shaped lower ring portion is adapted to overlap an insulating liner.

12. The system of claim 9, wherein the lower ring portion and upper shield portion comprise a protrusion and a detent so as to connect the ring portions together.

13. A consumable clamp ring for use in a processing chamber, comprising an annular upper shield portion adapted to be releasably coupled with a downwardly extending U-shaped annular lower ring portion and adapted to substantially cover an upper surface of the lower ring portion.

14. The clamp ring of claim 13, further comprising a shoulder on the upper shield portion adapted to align the upper shield portion with the lower ring portion.

15. The clamp ring of claim 14, wherein the upper shield portion comprises a lower portion adjacent the shoulder adapted to overlap an upper surface of the lower ring portion.

16. The clamp ring of claim 13, further comprising one or more holes in the upper shield portion adapted to receive one or more fasteners therein to couple the upper shield portion to a chamber component in the processing chamber.

17. The clamp ring of claim 13, wherein the upper shield portion and lower ring portion are coupled together with a protrusion on one of the portions and a corresponding detent on the other portion.

18. The clamp ring of claim 13, wherein the upper shield portion is adapted to disengage the lower ring portion as the upper shield portion is vertically displaced in the processing chamber.

* * * * *